US011728193B2

(12) United States Patent
Daigo

(10) Patent No.: US 11,728,193 B2
(45) Date of Patent: Aug. 15, 2023

(54) WAFER MANUFACTURING SYSTEM

(71) Applicant: SUMCO Corporation, Tokyo (JP)

(72) Inventor: Shigeru Daigo, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 17/783,556

(22) PCT Filed: Oct. 21, 2020

(86) PCT No.: PCT/JP2020/039528
§ 371 (c)(1),
(2) Date: Jun. 8, 2022

(87) PCT Pub. No.: WO2021/117351
PCT Pub. Date: Jun. 17, 2021

(65) Prior Publication Data
US 2023/0015459 A1 Jan. 19, 2023

(30) Foreign Application Priority Data
Dec. 9, 2019 (JP) ................. 2019-222402

(51) Int. Cl.
H01L 21/67 (2006.01)
(52) U.S. Cl.
CPC .. H01L 21/67294 (2013.01); H01L 21/67276 (2013.01)
(58) Field of Classification Search
CPC .......... G05B 19/042; G05B 2219/2602; G05B 15/00; G05B 11/00; G05B 21/00;
(Continued)

(56) References Cited

U.S. PATENT DOCUMENTS 5,537,325 A    7/1996 Iwakiri et al.
2004/0049898 A1* 3/2004 Imai ................ H01L 22/20
                                                118/712
(Continued)

FOREIGN PATENT DOCUMENTS

JP    H05-121521 A    5/1993
JP    2004-025057 A   1/2004
(Continued)

OTHER PUBLICATIONS

International Search Report issued in International Patent Application No. PCT/JP2020/039528, dated Jan. 19, 2021, along with an English translation thereof.

Primary Examiner — Kidest Bahta
(74) Attorney, Agent, or Firm — Greenblum & Bernstein, P.L.C.

(57) ABSTRACT

A wafer manufacturing system includes a wafer manufacturing device provided with a sensor; a host PC that is connected to the wafer manufacturing device via a data communication line; a logic controller that samples and stores an analog output signal of the sensor; and a relay PC that extracts tracking information transmitted on the data communication line for a wafer or a single crystal that is being processed by the wafer manufacturing device and sends the tracking information to the logic controller, and the logic controller stores a digital value of the analog output signal of the sensor in association with the tracking information that is sent from the relay PC.

20 Claims, 4 Drawing Sheets

(58) Field of Classification Search
CPC ......... H01L 21/67276; H01L 21/67294; H01L 29/00; H01L 2223/00
See application file for complete search history.

(56) References Cited

U.S. PATENT DOCUMENTS

| | | | |
|---|---|---|---|
| 2004/0073327 A1* | 4/2004 | Shimada | G05B 19/4184 700/108 |
| 2011/0250707 A1* | 10/2011 | Takano | G05B 19/128 257/E21.525 |
| 2014/0135972 A1* | 5/2014 | Galeb | B05C 11/1013 700/157 |
| 2017/0178936 A1* | 6/2017 | Shin | H01L 23/544 |

FOREIGN PATENT DOCUMENTS

| | | |
|---|---|---|
| JP | 2005-197387 A | 7/2005 |
| JP | 2006-093446 A | 4/2006 |
| JP | 2006-093641 A | 4/2006 |
| JP | 2009-64798 A | 3/2009 |

* cited by examiner

Fig. 3

| Date and time | Tracking info. | | Sensor output | |
|---|---|---|---|---|
| | LotID | SlotID | Temp. | Pressure |
| 2019/10/21 10:02:03.000 | ABCDEFGHIJ | 02 | 23.2 | 120.2 |
| 2019/10/21 10:02:03.100 | ABCDEFGHIJ | 02 | 23.1 | 120.5 |
| 2019/10/21 10:02:03.200 | ABCDEFGHIJ | 02 | 23.3 | 120.4 |
| 2019/10/21 10:02:03.300 | ABCDEFGHIJ | 02 | 23.2 | 120.6 |
| ⋮ | ⋮ | ⋮ | ⋮ | ⋮ |

WAFER MANUFACTURING SYSTEM

FIELD OF THE INVENTION

The present invention relates to a wafer manufacturing system, and specifically relates to a wafer manufacturing system that collects data measured by various sensors in a wafer manufacturing device.

BACKGROUND OF THE INVENTION

Silicon wafers are widely used as substrate materials for semiconductor devices. Silicon wafers for semiconductors are manufactured by going through various steps. First, a silicon single crystal ingot is manufactured via a single crystal manufacturing step by the Czochralski method and the like. Then, after performing peripheral grinding of a silicon single crystal ingot and cutting the ingot into slices to form wafers, a silicon wafer is completed by sequentially performing steps of lapping, etching, double-side polishing, single-side polishing, cleaning, and the like. Further, an annealing process for producing an annealed wafer, an epitaxial film deposition process for producing an epitaxial wafer, or a process for producing a Silicon-On-Insulator (SOI) wafer may be performed. The silicon wafer manufactured in this way is delivered as a wafer finished product after going through inspection steps. The inspections include not only a final inspection, but also inspections within steps, and are also performed as appropriate in intermediate stages between the single crystal manufacturing step and the completion of the final product.

Accompanying the recent miniaturization and high integration of semiconductor devices, various issues arise in semiconductor devices and their manufacturing processes. When such issues occur in a customer process and are conjectured to originate from the silicon wafers, there is an increasing need to analyze where in a wafer manufacturing process the issues with the silicon wafer arises. Under these circumstances, the wafer manufacturing process is successively recorded and stored in a database, and when an issue occurs, the record in the database is reviewed to determine the cause of the issue.

For management of a silicon wafer step, for example, Patent Literature 1 describes a manufacturing method of a semiconductor wafer that takes the order in which wafers are cut off from a material ingot as an identification number and applies the identification number to each of the wafers, traces a transport path indicative of how each wafer is transported through various manufacturing steps, and stores these as wafer information.

Also, Patent Literature 2 describes a management method and a management system of a single crystal ingot that performs process management of the single crystal ingot by, after a radio IC tag is attached to the single crystal ingot, writing data of the single crystal ingot into the radio IC tag and retrieving the data from the radio IC tag.

Further, Patent Literature 3 describes a data collection device that collects process data needed for a semiconductor manufacturing device, without any hindrance to production management that a host computer performs as a primary duty. In the prior art described in Patent Literature 3, a timing when the data is sent from the device is limited to only when an event message is sent when something happens with the device, and therefore, it is difficult to collect with arbitrary frequency such as a one-second cycle or 0.5 second cycle.

Patent Literature 4 describes a data collection server that collects reliable data which are synchronized in real time, without substantially increasing a load in using semiconductor manufacturing equipment. In Patent Literature 4, a timing of a start and end of non-routine data collection is set to be from the time when a message is received to the time when another message is received, non-routine data during that time is obtained, and the maximum, minimum, and average values are calculated and sent. In this case, it is not possible to collect output data of a sensor when no message is sent or received, or when the device is in an idle state and is not processing anything. In addition, since the maximum, minimum, and average values within a defined zone are being sent, data output values of the sensor are captured in cycles of one second or less, and data shifts cannot be captured as wave forms.

RELATED ART

Patent Literature

Patent Literature 1: Japanese Patent Laid-open Publication No. H05-121521
Patent Literature 2: Japanese Patent Laid-open Publication No. 2005-197387
Patent Literature 3: Japanese Patent Laid-open Publication No. 2009-064798
Patent Literature 4: Japanese Patent Laid-open Publication No. 2006-093641

SUMMARY OF THE INVENTION

Problems to Be Solved by the Invention

As described above, in order to analyze the cause of an issue originating from a silicon wafer that occurs in a customer process, it is necessary to successively record historical information on the kind of manufacturing process the silicon wafer goes through to yield a finished product. For this purpose, preferably, various physical quantities such as temperature and pressure that are measured during a manufacturing process of a silicon wafer are successively recorded to create a database.

However, some conventional wafer manufacturing devices are not capable of retrieving output signals from various sensors included in the wafer manufacturing devices in a short sampling cycle and cannot even accommodate such a specification change. Accordingly, the wafer manufacturing process is not successively recorded and cannot be stored in the database. In addition, most conventional wafer manufacturing devices only have a relatively low-speed SECS communication port and have no high-speed communication port, and therefore, even when the device can be modified to retrieve the output signals from various sensors in a short sampling cycle, there may be a case where the signals cannot be transferred externally at high speed.

Semiconductor manufacturing technology is advancing day by day, and the latest technologies are being introduced in rapid succession. However, there are various types of wafer manufacturing devices, and while some can be replaced with a state-of-the-art device, older generation devices can perform well for a long time, creating a situation where old devices and the latest devices are coexist. Since wafer manufacturing devices are very expensive, a device that is used as long as possible with modifications to accommodate the next generation of product lines is desired.

Accordingly, the present invention provides a wafer manufacturing system that can collect analog output signals of various sensors that measure physical quantities in a short sampling cycle while a wafer manufacturing device processes a wafer and also can save the signals in association with tracking information of a wafer being processed.

Means for Solving the Problems

In order to resolve the above concerns, a wafer manufacturing system according to the present invention includes a wafer manufacturing device provided with a sensor; a host PC that is connected to the wafer manufacturing device via a data communication line and controls the wafer manufacturing device; a logic controller that samples and stores an analog output signal of the sensor; and a relay PC that extracts tracking information transmitted on the data communication line for a wafer or a single crystal that is being processed by the wafer manufacturing device and sends the tracking information to the logic controller, and the logic controller stores a digital value of the analog output signal of the sensor in association with the tracking information that is sent from the relay PC.

According to the present invention, a measured value of the sensor in the wafer manufacturing device that is outputted during wafer processing can be collected in a short sampling cycle and also the measured value of the sensor can be saved in association with the tracking information of the wafer being processed. Therefore, even when the measured value of the sensor cannot be retrieved at high speed from a SECS communication port of the wafer manufacturing device, sensor output can be sampled at high speed and managed together with the tracking information unconstrained by SECS communication speed.

In the present invention, the wafer manufacturing device refers to various devices that are used in a wafer manufacturing process and examples include a single crystal pulling apparatus, peripheral grinder, band saw, wire saw, lapping device, etching device, double-side polisher, single-side polisher, cleaning device, epitaxial film deposition device, heat treatment furnace, and ion injection device. Further, the wafer manufacturing device also includes an inspection device and the like for evaluating quality of a wafer such as metallic or light element impurities like oxygen, wafer flatness, particles on the wafer surface, and the like.

The wafer manufacturing system according to the present invention further includes a data collection device that periodically collects the digital value of the analog output signal of the sensor stored in the logic controller, and the data collection device preferably records a data record in association with the date and time when the data was obtained, the data record consisting of a combination of the digital value of the analog output signal of the sensor stored in the logic controller and the tracking information. Accordingly, the measured value of the sensor can be synchronized with a tracking signal and the wafer manufacturing process can be successively recorded and stored in a database.

The logic controller preferably samples and stores the analog output signal of the sensor in a sampling cycle shorter than a cycle by which the data collection device collects the digital value from the logic controller. In this case, the data collection device preferably collects the digital value of the analog output signal of the sensor from the logic controller in a cycle of one second or less. By doing so, the measured value of the sensor can be reliably collected.

The tracking information is preferably at least one identification code selected from an ingot ID, block ID, wafer ID, lot ID, and slot ID. By synchronizing this tracking information with the output data from the sensor, the data can be used to analyze a wafer.

In the present invention, the logic controller preferably records the digital value of the analog output signal of the sensor even during a period when the wafer manufacturing device is not processing the wafer or single crystal. In addition, the logic controller preferably records the tracking information and the digital value of the analog output signal of the sensor with arbitrary frequency not dependent on an operating state of the wafer manufacturing device. Accordingly, the physical quantities measured in the silicon wafer manufacturing process can be updated and recorded reliably regardless of the operating state of the wafer manufacturing device.

Effect of the Invention

The present invention provides a wafer manufacturing system that can collect analog output signals of various sensors that measure physical quantities during wafer processing by a wafer manufacturing device in a short sampling cycle and also can save the signals in association with the tracking information of wafers being processed.

BRIEF DESCRIPTION OF THE DRAWINGS

FIG. 3 is an image of a data record that is stored in a PLC.

MODE FOR CARRYING OUT THE INVENTION

Hereafter, a preferred embodiment of the present invention is described in detail with reference to the attached drawings.

Figure 1:
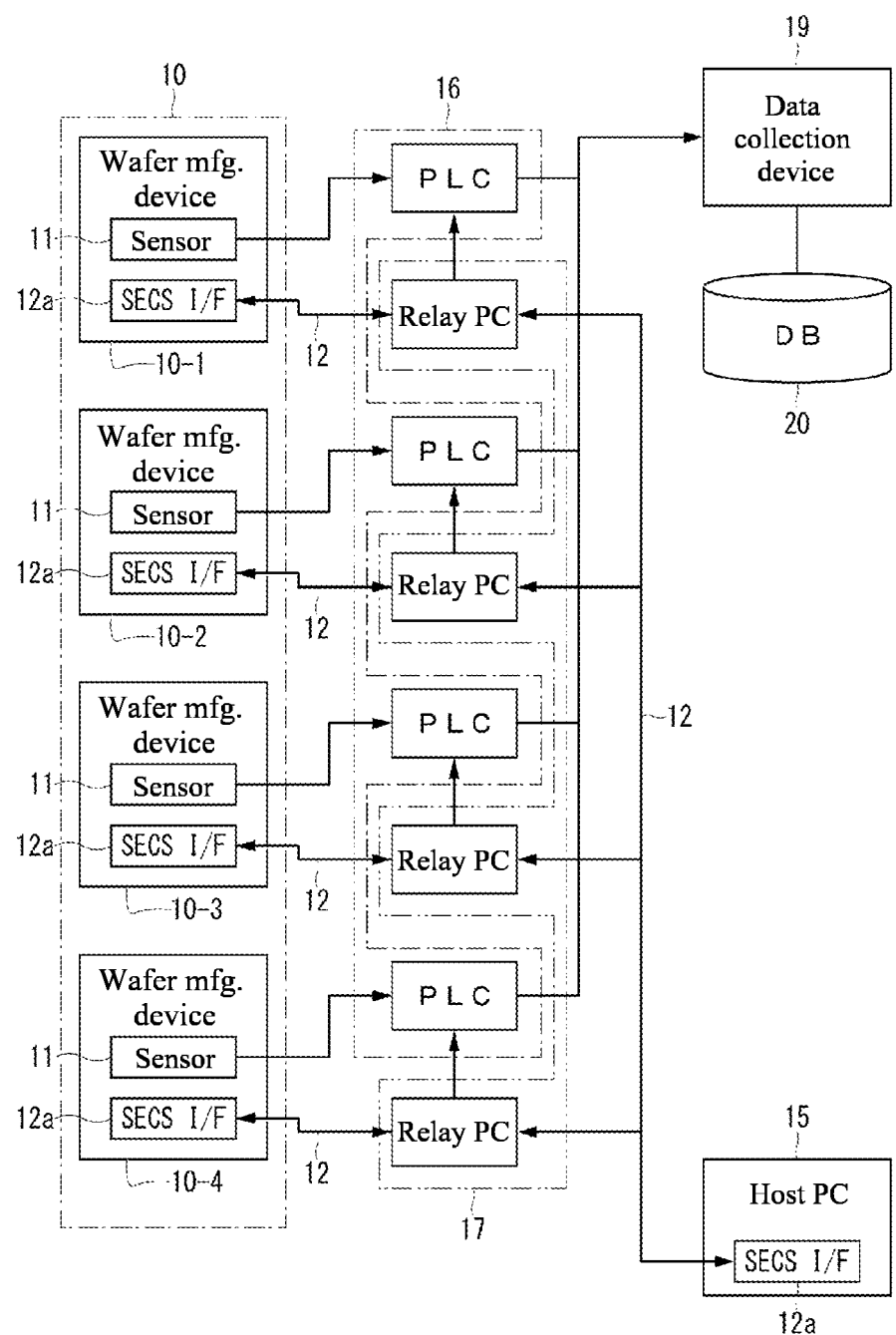
FIG. 1 is a block diagram illustrating a configuration of a wafer manufacturing system according to an embodiment of the present invention.

FIG. 1 is a block diagram illustrating a configuration of a wafer manufacturing system according to an embodiment of the present invention.

As shown in FIG. 1, a wafer manufacturing system 1 is a system that serves functions for collecting and managing measurement data of various physical quantities that are measured during a silicon wafer manufacturing process, and includes a wafer manufacturing device 10 provided with a sensor 11; a host PC 15 that is connected to the wafer manufacturing device 10 via a SECS communication line 12 that is a data communication line following a SEMI equipment communication standard (SECS) and controlling the wafer manufacturing device 10; a programmable logic controller (PLC) that samples and stores an analog output signal of the sensor 11; a relay PC (relay device) 17 that is provided on the SECS communication line 12 and extracts tracking information transmitted on the SECS communication line 12 for a silicon wafer or a single crystal (silicon block or silicon ingot) that is being processed by the wafer manufacturing device 10 and sends the tracking information to the PLC 16; and a data collection device 19 that periodically collects, in addition to the tracking information, a value obtained by converting the analog output signal of the sensor 11 stored by the PLC 16 into a digital value.

In the present embodiment, the wafer manufacturing system 1 collects data from four wafer manufacturing devices 10-1 to 10-4, however, the number of wafer manufacturing devices 10 is not particularly limited, and the type of wafer manufacturing devices 10 is not particularly limited either. The host PC 15 is a host device that integrally controls the wafer manufacturing devices 10-1 to 10-4, and the data collection device 19 is a device that collects various data from these four wafer manufacturing devices 10-1 to 10-4. The host PC 15 and the data collection device 19 are provided in common to these four wafer manufacturing devices 10-1 to 10-4, but the number of host PCs 15 and data collection devices 19 is not particularly limited either.

The wafer manufacturing device 10 refers to various devices that are used in the silicon wafer manufacturing process, and especially focuses on a device that performs SECS communication with the host PC 15. Specifically, the wafer manufacturing device 10 includes a single crystal pulling apparatus, peripheral grinder, band saw, wire saw, lapping device, etching device, double-side polisher, single-side polisher, cleaning device, epitaxial film deposition device, heat treatment furnace, ion injection device, and the like. Further, the wafer manufacturing device 10 includes an inspection device and the like for evaluating quality of a wafer such as metallic or light element impurities like oxygen, wafer flatness, particles on the wafer surface, and the like.

The type of sensor 11 provided in the wafer manufacturing device 10 is not particularly limited. For example, when the wafer manufacturing device 10 is a cleaning device, the data obtained by the cleaning device includes a flow rate, temperature, or chemical concentration of pure water or chemical solution. In addition, the data obtained by a heat treatment device includes a gas flow rate, temperature in a processing chamber, pressure in the processing chamber, heater temperature, heater power, cooling water flow rate, cooling water temperature, and the like. In particular, focus in on a wafer manufacturing device where a control software cannot be modified so as to allow data writing to the PLC 16.

The sensor 11 provided to the wafer manufacturing device 10 may be included from the beginning for controlling operations of the wafer manufacturing device 10, or a sensor may be provided separately from such a sensor. In the former case, an output signal of the sensor 11 is split into two branches where one output signal is used to control the operations of the wafer manufacturing device 10 and the other output signal is sent to the PLC 16 for collecting data. In the latter case, an output signal of a main sensor that is included by the wafer manufacturing device 10 from the beginning is used to control the operations of the wafer manufacturing device 10 while an output signal of an additional sensor is sent to the PLC 16 for collecting data.

Normally, the wafer manufacturing devices 10-1 to 10-4 include a SECS communication port 12a and are connected to the host PC 15 via the SECS communication line 12. SECS is a communication standard prepared for data communication between semiconductor manufacturing devices and has a communication speed of 9600 bps, which is relatively low-speed communication. It is particularly difficult to transfer measured values of various sensors in the wafer manufacturing device 10 in a short sampling cycle using such a communication interface. However, by capturing the output signals of the various sensors with the PLC 16 (external device) and retrieving the output signals from a system different from the SECS interface, the measurement data of various sensors can be transferred in a short sampling cycle.

The relay PC 17 is a computer that includes software (an application program) for relaying SECS communication. The relay PC 17 can receive messages sent to the wafer manufacturing device 10 by the host PC 15, and can also pass the messages along as-is to send out to the wafer manufacturing device 10. Messages can also be sent to the wafer manufacturing device 10 in place of the host PC 15. The relay PC 17 can also receive messages output by the wafer manufacturing device 10, and can also pass the messages as-is or can modify the messages as necessary and send the messages out to the host PC 15. Further, the relay PC 17 can extract the tracking information of the wafer being processed, which is included in data being sent and received between the host PC 15 and the wafer manufacturing device 10. The tracking information of the wafer being processed that is extracted in this way is sent to the PLC 16.

The tracking information refers to an identification code used to specify the silicon wafer or the single crystal being processed. Types of tracking information are not particularly limited as long as the silicon wafer or the single crystal being processed can be specified, but examples may include an ingot ID applied to a silicon ingot; a block ID applied to a silicon block cut from the silicon ingot; a wafer ID applied to a silicon wafer further cut from the silicon block; a lot ID shared by tens to hundreds of silicon wafers grouped under the same working conditions, processing conditions, and the like; and a slot ID applied to a silicon wafer housed in a slot inside a carrier case.

The PLC 16 includes a main processing unit (MPU), a memory, a signal inputter, a signal outputter, and a communicator, and captures the analog output signal of the sensor 11 in the respective wafer manufacturing device 10 in a predetermined sampling cycle and stores the signal in the memory. The PLC 16 samples the output signals of various sensors in cycles (100 ms for example) shorter than the data sampling cycles by a host data collection device 19. When the sensor 11 in the wafer manufacturing device 10 outputs a digital output signal, the PLC 16 can also capture the digital output signal from the sensor 11. The PLC 16 is provided independently from the wafer manufacturing device 10 and records the digital value of the analog output signal of the sensor 11 with arbitrary frequency not dependent on the operating state of the wafer manufacturing device 10. The PLC 16 can sample, update, and record the analog output signal of the sensor 11 unconstrained by the operating state of the wafer manufacturing device 10.

The communication port of the PLC 16 is connected to the data collection device 19 and data inside the PLC 16 is provided to the data collection device 19. In the present embodiment, the PLC 16 converts the analog output signal of the sensor 11 into the digital value and stores the value in association with the tracking information that is sent from the relay PC 17. The measurement data of the sensor 11 is retrieved regardless of the operation of the wafer manufacturing device 10, and therefore the relationship between the measurement data of the sensor 11 and the silicon wafer or the single crystal is unclear, and the measurement data cannot be used as data for analyzing the silicon wafer. However, when the measurement data of the sensor 11 is saved in association with the tracking information, it is possible to know which silicon wafer or single crystal was being processed when the measurement data of the sensor 11 was measured, and creating a database of various data measured during the wafer manufacturing process is easy.

The data collection device 19 periodically retrieves a data record consisting of a combination of the tracking information and the value stored in the PLC 16 that is obtained by converting the analog output signal from each of the various sensors 11 into the digital value, and records the data record in association with the date and time when the data was obtained. Specifically, after collecting the data record in a one-second cycle, for example, the record is stored in a database 20. The PLC 16 preferably samples and stores the analog output signal of the sensor 11 in a sampling cycle shorter than a cycle by which the data collection device 19 collects the digital value. In this case, the data collection device 19 preferably collects the digital output signal from the PLC 16 in a cycle of one second or less.

Figure 2:
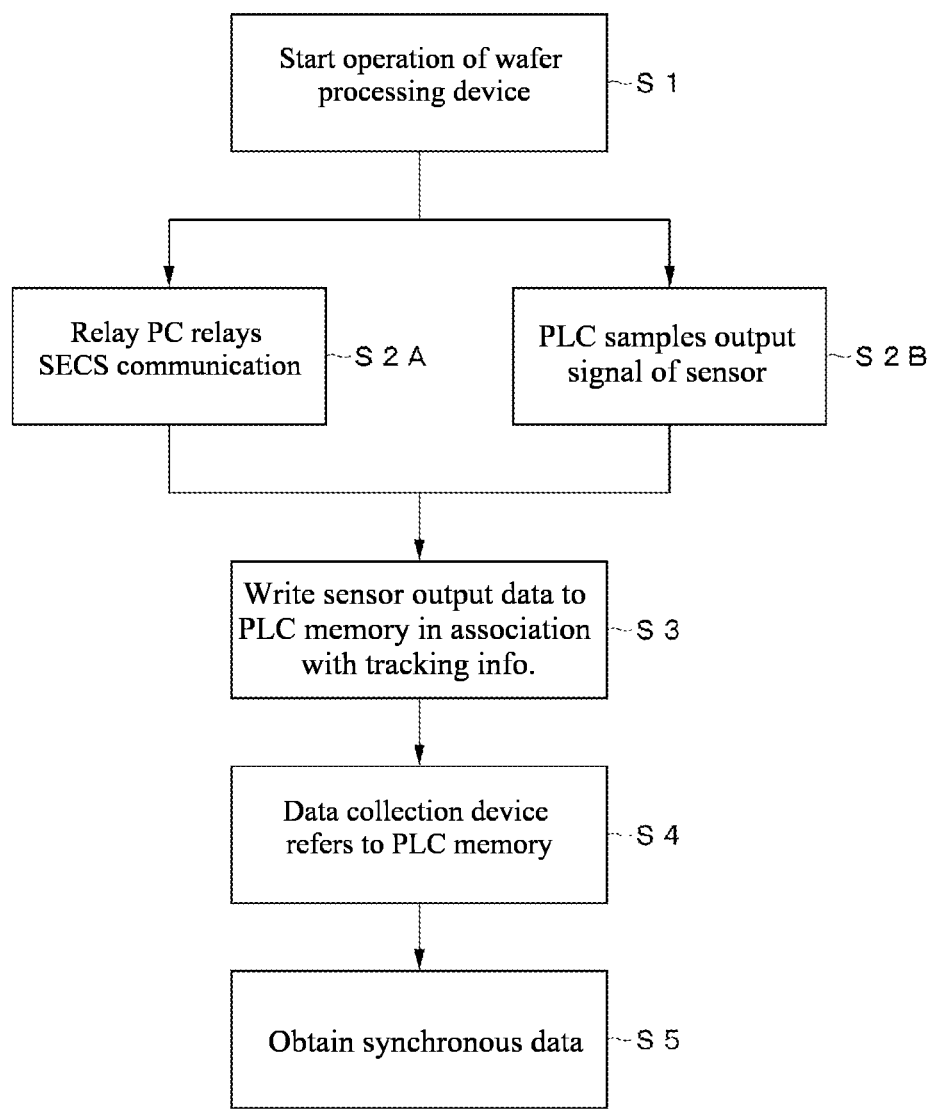
FIG. 2 is a flow chart illustrating operations of the wafer manufacturing system.

FIG. 2 is a flow chart illustrating operations of the wafer manufacturing system 1.

As shown in FIG. 2, in accordance with an instruction from the host PC 15, the wafer manufacturing device 10 (the wafer processing device) starts processing the wafer or single crystal (step S1). Processing of the wafer or single crystal varies from blocking to slicing, polishing, cleaning, heat treatment, deposition treatment, or the like, and each process is different. From the start of wafer processing to the end, SECS communication is performed between the host PC 15 and the wafer manufacturing device 10.

While the wafer or single crystal is being processed, the sensor 11 of the wafer manufacturing device 10 measures physical quantities such as temperature and pressure. The analog output signal of the sensor 11 of the wafer manufacturing device 10 is used for operating the wafer manufacturing device 10 and therefore, fundamentally, using the signal inside the wafer manufacturing device 10 is sufficient and there is no need to output the signal to an exterior. However, as described above, collecting a log of measurement data of various sensors is desired to check retroactively for issues in manufacturing the wafer. In the present embodiment, a log of data measured during wafer processing can be collected, and it is possible to identify the measured values of the various sensors, retrieved independently of control by the wafer manufacturing device 10, as the measured values obtained during processing of a certain wafer.

The relay PC 17 relays SECS communication between the wafer manufacturing device 10 and the host PC 15, extracts the tracking information included in the communication message, and writes to the memory of the PLC 16 (step S2A).

Meanwhile, the PLC 16 samples the analog output signal outputted from the sensor 11 during the processing of the wafer or the single crystal by the wafer manufacturing device 10 and writes the analog output signal to the memory in the PLC 16 as digital data (step S2B). At this time, the tracking information and digital data of the analog output signal of the sensor 11 are written to the same register on the PLC 16 and the measurement data of the sensor 11 is associated with the tracking information.

The PLC 16 preferably records the digital value of the analog output signal of the sensor 11 even during a period when the wafer manufacturing device 10 is not processing a wafer or single crystal. Accordingly, the physical quantities measured in the silicon wafer manufacturing process can be updated and recorded reliably regardless of the operating state of the wafer manufacturing device 10.

The data collection device 19 can refer to the memory in the PLC 16 and access the measurement data of the various sensors that is associated with the tracking information and stored in the memory in the PLC 16. The data collection device 19 accesses the PLC 16 in a one-second cycle, for example, and collects a data record consisting of a combination of the digital value of the analog output signal of the sensor 11 and the tracking information, associating the data record with the date and time when the data was obtained (step S4). In this way, the data collection device 19 can obtain data synchronizing the tracking information and the digital value of the analog output signal of the sensor 11 in the wafer manufacturing device 10 (step S5).

FIG. 3 is an image of a data record that is stored in the PLC 16.

As shown in FIG. 3, the memory in the PLC 16 stores the tracking information of the wafer or the single crystal being processed that is extracted from a SECS communication message and an output value of the sensor 11 in the wafer manufacturing device 10 together with data including the date and time when the data is obtained. In this example, the measured value of a temperature sensor and a pressure sensor in the wafer manufacturing device 10 are recorded every 100 ms. Also, the lot ID and slot ID of the wafer being processed are recorded as the tracking information. When a plurality of silicon wafers are housed in the carrier case, the wafer ID of each wafer is managed on the database in association with the slot ID of the carrier case, and therefore the wafer ID can be identified from the slot ID by referring to the database managed by the host PC 15.

Figure 4A:
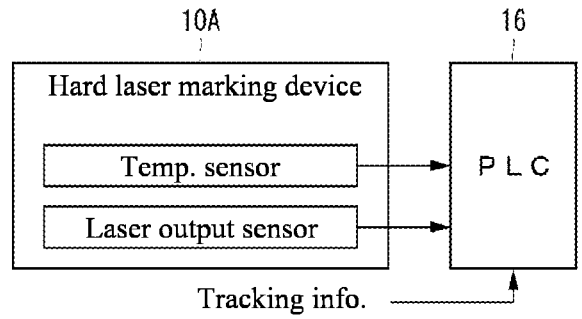
FIG. 4A to 4C are block diagrams illustrating specific examples of various sensors and types of a wafer manufacturing device.
Figure 4B:
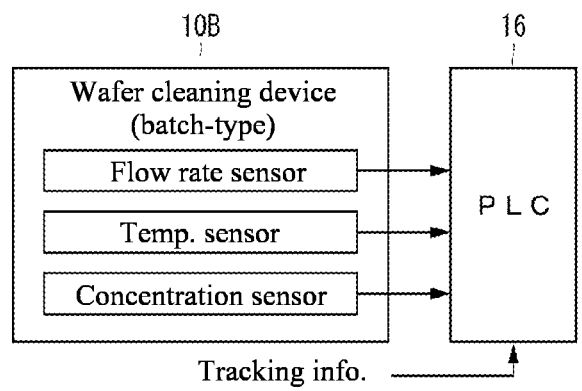
Figure 4C:
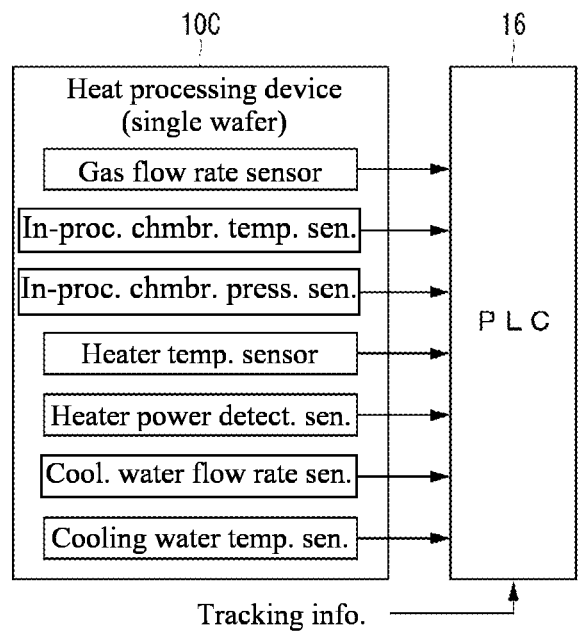

FIGS. 4A to 4C are block diagrams illustrating specific examples of various sensors and types of the wafer manufacturing device 10.

As shown in FIG. 4A, when the wafer manufacturing device 10 is a hard laser marking device 10A, for example, output of a temperature sensor detecting the temperature of a laser output unit, a laser output value, and the like are collected for data collection. The hard laser marking device 10A is a device that marks IDs on a wafer finished product using a laser, which may cause defects such as unclear marking and unreadable characters.

Further, as shown in FIG. 4B, when the wafer manufacturing device 10 is a batch-type wafer cleaning device 10B, for example, output of a flow sensor, output of the temperature sensor, output of a concentration sensor, and the like are collected for data collection.

Furthermore, as shown in FIG. 4C, when the wafer manufacturing device 10 is a single wafer heat processing device 10C, for example, a gas flow rate sensor of an inert gas, a dopant gas, or the like supplied in a processing chamber, an in-processing chamber temperature sensor detecting the temperature in the processing chamber, an in-processing chamber pressure sensor, a heater temperature sensor detecting the temperature of a heater that heats the wafer, a heater power detection sensor (detection circuit) detecting power of the heater, a cooling water flow rate sensor detecting the flow rate of cooling water, a cooling water temperature sensor detecting the temperature of the cooling water, and the like are subject to data collection.

As described above, the wafer manufacturing system 1 according to the present embodiment captures and records in the PLC 16 the analog output signal of the sensor 11 provided to the wafer manufacturing device 10, and therefore, the sampling data of the sensor 11 can be obtained in a short cycle and in particular, data sampling in a very short cycle that cannot be handled by SECS communication becomes possible. In addition, the relay PC 17 that relays SECS communication (including HSMS) between the wafer manufacturing device 10 and the host PC 15 extracts the tracking information included in the communication data, and therefore the tracking information related to the wafer currently being processed can be easily obtained. Further, since the output data of the sensor 11 is saved in association with the tracking information of the wafer currently being processed, the data outputted from two interfaces that differ from each other, i.e., the data over SECS communication and sampling value of the analog output signal, can be obtained already associated with each other and can be used as data to analyze a specific wafer. The present invention is effective when the software in the existing wafer manufacturing device 10 cannot be modified so as to be able to retrieve and save the measured value of the sensor 11.

The preferable embodiment of the present invention was described above, but the present invention is not limited to the embodiment noted above, and various modifications are possible without departing from the scope of the present invention, and such modifications are, of course, covered by the scope of the present invention.

For example, in the embodiment described above, a case of manufacturing a silicon wafer is given as an example, however the present invention is not limited to a silicon wafer and can be applied to wafers of a variety of material that require collection of data measured by the sensor 11 during wafer processing. However, in a manufacturing system for a semiconductor silicon wafer, the effect of the present invention is noticeable because there are large generation gaps between devices in addition to the large number and types of devices.

DESCRIPTION OF REFERENCE NUMERALS

1 Wafer manufacturing system
10, 10-1 to 10-4 Wafer manufacturing device
10A Hard laser marking device
10B Wafer cleaning device r
10C Single wafer heat processing device
11 Sensor
12 SECS communication line
12a SECS communication port
15 Host PC
16 PLC (Programmable logic controller)
17 Relay PC
19 Data collection device
20 Database

The invention claimed is:

1. A wafer manufacturing system comprising:
a wafer manufacturing device provided with a sensor;
a host PC that is connected to the wafer manufacturing device via a data communication line and controls the wafer manufacturing device;
a logic controller that is external and independent from the wafer manufacturing device, wherein the logic controller samples and stores an analog output signal of the sensor; and
a relay PC that is separate from the wafer manufacturing device and extracts tracking information transmitted on the data communication line for a wafer or a single crystal that is being processed by the wafer manufacturing device and sends the tracking information to the logic controller, wherein
an analog output signal of the sensor is split into two branches where one analog output signal is used to control operations of the wafer manufacturing device and the other analog output signal is sent to the logic controller for collecting data, wherein
the logic controller stores a digital value of the other analog output signal of the sensor in association with the tracking information that is sent from the relay PC, and wherein
the relay PC receives and sends signals between the host PC and the wafer manufacturing device.

2. The wafer manufacturing system according to claim 1, further comprising a data collection device that periodically collects the digital value of the analog output signal of the sensor stored in the logic controller, wherein
the data collection device records a data record in association with the date and time when data was obtained, the data record consisting of a combination of the digital value of the analog output signal of the sensor stored in the logic controller and the tracking information.

3. The wafer manufacturing system according to claim 2, wherein the logic controller samples and stores the analog output signal of the sensor in a sampling cycle shorter than a cycle by which the data collection device collects the digital value from the logic controller.

4. The wafer manufacturing system according to claim 3, wherein the data collection device collects the digital value of the analog output signal of the sensor from the logic controller in a cycle of one second or less.

5. The wafer manufacturing system according to claim 1, wherein the tracking information is at least one identification code selected from an ingot ID, block ID, wafer ID, lot ID, and slot ID.

6. The wafer manufacturing system according to claim 1, wherein the logic controller records the digital value of the analog output signal of the sensor even during a period when the wafer manufacturing device is not processing the wafer or single crystal.

7. The wafer manufacturing system according to claim 1, wherein the logic controller records the tracking information and the digital value of the analog output signal of the sensor with arbitrary frequency not dependent on an operating state of the wafer manufacturing device.

8. The wafer manufacturing system according to claim 1, the logic controller consisting of a first input that receives signals from the sensor, a second input that receives signals from the relay PC, and an output that transmits signals to a data collection device.

9. The wafer manufacturing system according to claim 1, wherein the relay PC is provided on the data communication line.

10. The wafer manufacturing system according to claim 1, wherein the relay PC is a computer including software for relaying data communication.

11. A wafer manufacturing system comprising:
a wafer manufacturing device provided with a main sensor and an additional sensor;
a host PC that is connected to the wafer manufacturing device via a data communication line and controls the wafer manufacturing device;
a logic controller that is external and independent from the wafer manufacturing device, wherein the logic controller samples and stores an analog output signal of the additional sensor; and
a relay PC that is separate from the wafer manufacturing device and that extracts tracking information transmitted on the data communication line for a wafer or a single crystal that is being processed by the wafer manufacturing device and sends the tracking information to the logic controller, wherein
an analog output signal of the main sensor is used to control operations of the wafer manufacturing device and an analog output signal of the additional sensor is sent to the logic controller for collecting data, wherein the logic controller stores a digital value of the analog output signal of the additional sensor in association with the tracking information that is sent from the relay PC, and wherein the relay PC receives and sends signals between the host PC and the wafer manufacturing device.

12. The wafer manufacturing system according to claim 11, further comprising a data collection device that periodically collects the digital value of the analog output signal of the additional sensor stored in the logic controller, wherein the data collection device records a data record in association with the date and time when data was obtained, the data record consisting of a combination of the digital value of the analog output signal of the additional sensor stored in the logic controller and the tracking information.

13. The wafer manufacturing system according to claim 12, wherein the logic controller samples and stores the analog output signal of the additional sensor in a sampling cycle shorter than a cycle by which the data collection device collects the digital value from the logic controller.

14. The wafer manufacturing system according to claim 13, wherein the data collection device collects the digital value of the analog output signal of the additional sensor from the logic controller in a cycle of one second or less.

15. The wafer manufacturing system according to claim 11, wherein the tracking information is at least one identification code selected from an ingot ID, block ID, wafer ID, lot ID, and slot ID.

16. The wafer manufacturing system according to claim 11, wherein the logic controller records the digital value of the analog output signal of the additional sensor even during a period when the wafer manufacturing device is not processing the wafer or single crystal.

17. The wafer manufacturing system according to claim 11, wherein the logic controller records the tracking information and the digital value of the analog output signal of the additional sensor with arbitrary frequency not dependent on an operating state of the wafer manufacturing device.

18. The wafer manufacturing system according to claim 11, the logic controller consisting of a first input that receives signals from the additional sensor, a second input that receives signals from the relay PC, and an output that transmits signals to a data collection device.

19. The wafer manufacturing system according to claim 11, wherein the relay PC is provided on the data communication line.

20. The wafer manufacturing system according to claim 11, wherein the relay PC is a computer including software for relaying data communication.

* * * * *